United States Patent
Sase et al.

[11] Patent Number: 6,156,831
[45] Date of Patent: Dec. 5, 2000

[54] MODIFIED CYANATE ESTER GROUP CURABLE RESIN COMPOSITION AND VARNISH, PREPREG, METAL CLAD LAMINATED BOARD, FILM, PRINTED CIRCUIT BOARD, AND MULTILAYERED CIRCUIT BOARD USING THE SAME

[75] Inventors: Shigeo Sase; Yasuyuki Mizuno; Takeshi Sugimura; Harumi Negishi, all of Shimodate, Japan

[73] Assignee: Hitachi Chemical Company, Ltd., Tokyo, Japan

[21] Appl. No.: 09/108,204

[22] Filed: Jul. 1, 1998

[30] Foreign Application Priority Data

| Jul. 4, 1997 | [JP] | Japan | 9-179572 |
| Jul. 7, 1997 | [JP] | Japan | 9-181144 |
| Oct. 23, 1997 | [JP] | Japan | 9-290576 |
| Oct. 23, 1997 | [JP] | Japan | 9-290579 |

[51] Int. Cl.$^7$ ........................................ C08K 5/34
[52] U.S. Cl. ........................ 524/101; 428/209; 524/412
[58] Field of Search ........................ 544/219; 524/100, 524/412; 525/390; 528/422

[56] References Cited

U.S. PATENT DOCUMENTS

| 3,950,306 | 4/1976 | Pews et al. | 524/101 |
| 4,496,695 | 1/1985 | Sugio et al. | 525/391 |
| 4,503,186 | 3/1985 | Sugio et al. | 525/391 |
| 4,604,452 | 8/1986 | Shimp | 528/422 |
| 4,608,434 | 8/1986 | Shimp | |
| 4,785,075 | 11/1988 | Shimp | 528/422 |
| 4,983,683 | 1/1991 | Shimp | 525/390 |
| 5,623,006 | 4/1997 | Papathomas | 524/100 |

FOREIGN PATENT DOCUMENTS

| 46-4112 | 12/1971 | Japan . |
| 52-31279 | 8/1977 | Japan . |
| 61-18937 | 5/1986 | Japan . |
| 63-33506 | 7/1988 | Japan . |
| 5-77705 | 10/1993 | Japan . |
| 5-311071 | 11/1993 | Japan . |
| 6-92533 | 11/1994 | Japan . |

*Primary Examiner*—Veronica P. Hoke
*Attorney, Agent, or Firm*—Antonelli, Terry, Stout & Kraus, LLP

[57] ABSTRACT

A modified cyanate ester group curable resin composition, and varnishes, prepregs, laminated boards adhered with metal foil, films, printed circuit boards, and multilayered circuit boards using the same, comprising:

(A) a cyanate ester group compound
(B) a monovalent phenolic group compound
(C) a polyphenylene ether resin,
(D) a flame retardant not reactive with the cyanate ester group compound, and
(E) a metal group reaction catalyst.

10 Claims, No Drawings

MODIFIED CYANATE ESTER GROUP CURABLE RESIN COMPOSITION AND VARNISH, PREPREG, METAL CLAD LAMINATED BOARD, FILM, PRINTED CIRCUIT BOARD, AND MULTILAYERED CIRCUIT BOARD USING THE SAME

BACKGROUND OF THE INVENTION

The present invention relates to a modified cyanate ester group curable resin composition, and varnish, prepreg, metal clad laminated board, film, printed circuit board, and a multilayered circuit board using the same.

A large volume of data is required to be processed with a high speed in a highly information-oriented society, and consequently, the frequency of signals used in computers and information terminals has become higher and higher in recent years. However, since an electric signal has a property that its transmission loss becomes larger as the frequency becomes higher, developing a low-loss printed circuit board capable of coping with such high frequencies has become an important requirement of the industry.

The transmission loss of a printed circuit board comprises a conductor loss depending on the shape of the circuit (conductor), a skin-effect resistance, a characteristic impedance, as well as the like, as well as a dielectric loss depending on the dielectric properties of the insulating layer (dielectric) around the circuit. The dielectric loss is dominant in the overall electric loss in a high frequency circuit. Therefore, in order to reduce the transmission loss of the high frequency circuit, it is apparent that reducing the dielectric constant and the dissipation factor (tan δ) of the printed circuit board (particularly, the insulating resin) is necessary. For example, in the field of mobile communication equipment dealing with high frequency signals, printed boards having a low dissapation factor are strongly required in order to reduce the transmission loss in a quasi-microwave band (1 to 3 GHz) as the frequency of signals is increased.

On the other hand, in the field of electronic information equipment, such as computers, the development of high speed microprocessors having an operating frequency exceeding 200 MHz and an increase of signal frequency has been advancing rapidly in order to handle increasing larger volume of information in a short time. In the equipment using such high speed pulse signals, the signal delay time on the printed circuit board becomes a problem. Since the signal delay time on the printed circuit board becomes longer in proportion to the square root of a specific dielectric constant $\epsilon$ r of the insulator around the circuit, resins having a low dielectric constant are required for circuit boards used in a computer and the like.

Regarding resin compositions for improving the high frequency property of the printed circuit board and which are capable of coping with the trend toward the use of increasingly higher frequency signals, as described above, a method using a Cyanate ester/epoxy resin composition has been disclosed in JP-B-46-41112 (1971), and a method using a bismaleimide/Cyanate ester/epoxy resin composition has been disclosed in JP B-52-31279 (1977), as a composition using a Cyanate ester resin having the lowest dielectric constant among thermosetting resins.

As a method of improving the high frequency property using a thermoplastic resin, methods of using polyphenylene ether group resin compositions having a desirable dielectric property among heat-resistant thermoplastic resins, such as a resin composition composed of a polyphenylene ether resin (PPO or PPE) and a cross linking polymer/monomer has been disclosed in JP-B-5-77705 (1993), and a resin composition composed of a polyphenylene ether having a specific curable functional group and a cross linking monomer has been disclosed in JP-B-6-92533 (1994).

Further, as a means of improving the high frequency property using a resin composition composed of a cyanate ester resin having a low dielectric constant and a polyphenylene ether resin having a desirable dielectric property, a method of using a resin composition composed of a cyanate ester/bismaleimide and a polyphenylene ether resin has been disclosed in JP-B-63-33506 (1988), and a method of using a resin composition composed of a phenol modified resin/cyanate ester reactant and polyphenylene ether resin has been disclosed in JP-A-5-311071 (1993). Furthermore, a resin composition prepared by kneading a polyphenylene ether resin and a cyanate ester resin has been disclosed in JP-B-61-18937 (1986) as a heat resistant molding material having a desirable frequency characteristics.

The methods disclosed in JP-B-46-41112 (1971) and JP-B-52-31279 (1977), respectively, had a problem in that the high frequency property was insufficient though the dielectric constants were slightly lowered, because the resin compositions contained thermosetting resins other than a cyanate ester resin.

The methods disclosed in JP-B-5-77705 (1993) and JP-B-6-92533 (1994) also had a problem in that the resin compositions were high in molten viscosity and lacked in resin flow, though their dielectric constants were somewhat improved, because the main component of the resin compositions was a polyphenylene ether resin which was essentially a thermoplastic resin. Therefore, the resin compositions required a high temperature and a high pressure for pressurized molding of the laminated board, and were unsuitable for forming a multilayer printed circuit board, which a required to fill a very small space in a circuit pattern, because of insufficient moldability.

The methods disclosed in JP-B-63-33506 (1988) and JP-A-5-311071 (1993) had a problem in that the high frequency property was still insufficient, though the dielectric constants were somewhat improved, because the thermosetting resin used together with the polyphenylene ether resin was a bismaleimide/cyanate ester resin or a phenol modified resin/cyanate ester reactant. When the quantity of polyphenylene ether resin was increased, the resin composition became high in molten viscosity and lacked in fluidity, thereby to decrease the moldability, similar to the case of the polyphenylene group resin composition described above.

The resin composition prepared by kneading polyphenylene ether resin and cyanate ester resin disclosed in JP-B-61-18937 (1986) had a desirable dielectric property and a relatively preferable moldability, because the molten viscosity was lowered by being modified by cyanate ester resin. However, when cyanate ester was singly used as a curing composition, the problem that the dielectric property of the cured resin had a high dissapation factor, while the dielectric constant was relatively low, still remained. Further, when the quantity of cyanate ester was decreased (the quantity of polyphenylene ether resin was increased) in order to lower the dissapation factor, the problem that the molten viscosity of the resin composition was increased to make the fluidity insufficient still remained, and the moldability was decreased, similar to the case of the polyphenylene group resin composition described above.

SUMMARY OF THE INVENTION

A first object of the present invention is to provide a modified cyanate ester group curable resin composition having a desirable heat resistance, a similar moldability and workability as a conventional thermosetting resin, such as an epoxy resin, a low dielectric property, and a low dissapation factor and a low loss property in the high frequency band.

A second object of the present invention is to provide a flame retardant resin film using a modified cyanate ester group curable resin composition, and a method for manufacturing the same.

An overall object of the present invention is to provide a resin film using a modified cyanate ester group curable resin composition, and a method for manufacturing the same.

A third object of the present invention is to provide a modified cyanate ester group curable resin varnish for a printed circuit board using a modified cyanate ester group curable resin composition, and a method for manufacturing the same.

A fourth object of the present invention is to provide methods of manufacturing prepreg for a laminated board and metal clad laminated board, using the modified cyanate ester group curable resin varnish.

A fifth object of the present invention is to provide a multilayered circuit board manufactured by laminating a printed circuit board and/or an inner layer circuit board, which are manufactured by patterning the circuit on the laminated board manufactured by the above method of manufacturing prepreg for a laminated board and a metal clad laminated board, and a prepreg, film, and/or a film adhered with metal foil, which are manufactured by the above method, and for forming circuits for making connections between inner circuits to each other and to the metal foil.

The first object of the present invention can be achieved with a modified cyanate ester group curable resin composition comprising essentially (A) a cyanate ester group compound expressed by the chemical formula (1), (B) a monovalent phenolic group compound expressed by any one of the chemical formula (2) and (3), (C) a polyphenylene ether resin, (D) a flame retardant not reactive with the cyanate ester group compound and (E) a metal group reaction catalyst.

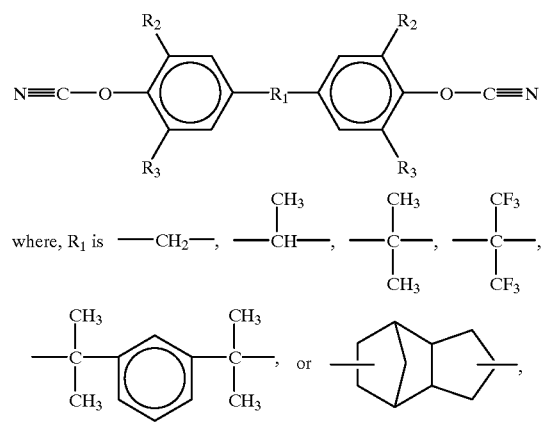

Formula (1)

and respective of $R_2$ and $R_3$ is hydrogen or a methyl group, and both can be the same or different from each other)

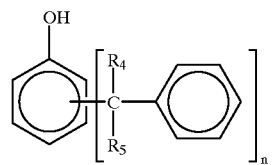

Formula (2)

(where, respective of $R_4$ and $R_5$ is any one of a hydrogen atom and low alkyl group having carbon number of 1 to 4, and both can be the same or different from each other. n is a positive integer of 1 or 2.)

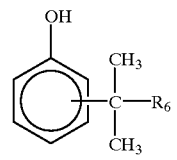

Formula (3)

(where, $R_6$ is —$CH_3$, —$CH_2CH_3$, or

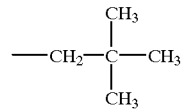

It is preferable to use a modified cyanate ester group curable resin composition, which is prepared by mixing (B) the monovalent phenolic group compound expressed by the chemical formula (2) or (3) at 4 to 30 parts by weight with 100 parts by weight of (A) the cyanate ester group compound expressed by the chemical formula (1).

The second object of the present invention can be achieved by a flame-retardant resin film manufactured by semi-curing or curing a modified cyanate ester group curable resin composition including a flame-retardant not reactive with a cyanate ester group compound. The method of manufacturing the flame-retardant resin film can be achieved by a method comprising the steps of applying the varnish comprising the modified cyanate ester group curable resin composition including the flame retardant and a solvent onto one side plane of a carrier by a flowing method, and removing the solvent by heating and drying to form the film.

The third object of the present invention can be achieved with the modified cyanate ester group curable resin varnish comprising essentially (F) an aromatic hydrocarbon group solvent, and (G) a ketone group solvent, in addition to the modified cyanate ester group curable resin composition. The method of manufacturing the varnish with the modified cyanate ester group curable resin composition for the printed circuit board can be achieved by a method including the steps of dissolving (C) polyphenylene ether resin into (F) the aromatic hydrocarbon group solvent by heating, reacting subsequently (A) the cyanate ester group compound with (B) the monovalent phenolic group compound in the presence of (E) the metal group reaction catalyst in the above solution to produce a mutually dissolving solution of the modified cyanate ester resin and the polyphenylene ether resin, and suspending the mutually dissolving resins by adding and agitating (G) the ketone group solvent.

The fourth object of the present invention can be achieved by the method for manufacturing prepreg for a laminated board, which comprises impregnating the modified cyanate ester group resin varnish for a printed circuit board into a substrate, and subsequently drying the impregnated substrate at a temperature in the range of 80–200° C., and the method for manufacturing a metal clad laminated board, which comprises piling up one or plural prepregs for the laminated board, piling up one or plural metal foils at the upper and lower end planes of the pile, or either plane, and heating and pressurizing the pile to form the metal clad laminated board.

The fifth object of the present invention can be achieved by a method of manufacturing a multilayered circuit board comprising the steps of manufacturing a printed circuit board by patterning circuits onto the metal clad laminated board manufactured by the above method for obtaining a metal clad laminated board, wherein the metal is plated onto both side planes and/or one side plane, with a conventional process such as forming through-holes, metal plating, etching, and the like; laminating the prepreg, the film, or a combination of the prepreg and the film, onto the surface of the printed circuit board as an inner layer board, with a metal foil being further laminated thereon, by heating and pressurizing a pile of those materials; forming a window at a place on the metal foil, where a via-hole for connecting the inner layer circuit and the outer layer circuit must be formed, using a photosensitive resin or screen printing so that the metal foil at the place where the via-hole must be formed is exposed; forming via-holes through to the inner layer circuit by a laser beam drilling process using the metal foil as a mask after removing the metal foil exposed in the window by etching; connecting the inner layer circuit and the outer layer circuit by metal plating including the inner wall of the via-holes; and manufacturing circuits onto an outer surface of the metal foil to obtain the multilayered circuit board.

By repeating the above steps of the method of manufacturing a multilayered circuit board using the multilayered circuit board manufactured by the once-through operation of the above steps as the inner layer board, a multilayered circuit board having a large number of layers can be manufactured.

Another multilayered circuit board can be manufactured by using a film adhered with a metal foil instead of the prepreg and the film in the above steps, piling up the film adhered with the metal foil onto an inner layer board so that the film plane is contacted with the inner layer board, and applying heating and pressurizing to laminate them.

The dielectric property of a polymer material is strongly affected by the polarization alignment of dipoles. Therefore, the dielectric constant can be decreased by decreasing the number of polar groups in the molecule, and the dissapation factor can be lowered by suppressing the mobility of the polar groups. Since a cyanate ester resin produces a symmetric and rigid triazine structure when being cured, though it has a strong polar cyanate group, a cyanate ester resin can provide a cured material having the lowest dielectric constant and dissapation factor among the thermosetting resins.

However, in the actual curing reaction, the cyanate groups in the cyanate ester resin cannot all react to produce the triazine structure. The reaction system gradually loses its fluidity as the curing reaction progresses, and some cyanate groups remain in the system as non-reacted cyanate groups. As a result, only a cured resin having a dielectric constant and dissapation factor values higher than what the cured resin should essentially have was manufactured.

On the other hand, the resin composition in accordance with the present invention is aimed at decreasing the dielectric constant and the dissapation factor of the cured resin by adding an appropriate quantity of (B) monovalent phenolic group compound in order to convert the remaining non-reacted cyanate groups into imidocarbonate for decreasing the polarity of the cured resin. A suitable material used for this purpose is a chemical composition which is highly reactive with the cyanate group, and is single functional, relatively low in molecular weight, and mutually soluble with a cyanate ester resin (similar in molecular structure). The monovalent phenolic group compounds used in the resin composition of the present invention are specified by the above reason.

Conventionally, a phenolic compound such as nonylphenol and the like was used as an auxiliary catalyst for trimerizing reaction of cyanate ester (forming triazine rings) by adding approximately 1 to 2 parts by weight to 100 parts by weight of cyanate ester. However, since the amount added was actually a catalyst quantity, the effect of the phenolic compound to decrease the polarization by reacting with the cyanate group as above was not observed. According to the inventors' study of the added quantity of the phenolic compounds, it was found that the dielectric constant and the dissapation factor of the cured material could be decreased by adding more of the phenolic compound than the conventional quantity, and a decrease in heat resistance due to increase in the added quantity of the phenolic compound could be suppressed by using a specific monovalent phenolic group compound. Therefore, according to the method of the present invention, it became possible to obtain; the cured material having a dielectric constant and a dissapation factor lower than those of the conventional cured materials of a single cyanate ester resin and the conventional cured material of resin composed of epoxy resin, a multivalent phenol group (hydroxyl in one side was apt to remain as a non-reacted group, which deteriorated the dielectric property), bismaleimide, and the like.

Therefore, in accordance with the modified cyanate ester group curable resin composition of the present invention, the added quantity of the monovalent phenolic group compound is important. That is, the monovalent phenolic group compound cannot react with all the non-reacted remaining cyanate group to decrease the polarization when the quantity added is small, and the monovalent phenolic group compound itself remains as non-reactants to deteriorate the dielectric property of the cured material by the polarity of the hydroxyl of the monovalent phenolic group compound itself when the quantity added is more than necessary.

Further, in accordance with the modified cyanate ester group curable resin composition of the present invention, improving the dielectric property is intended by adding (C) the polyphenylene ether resin, which is a thermoplastic resin having a desirable dielectric property, to the modified cyanate ester resin. The cyanate ester resin and the polyphenylene ether resin are essentially not soluble with each other, and it is difficult to obtain a uniform resin. However, according to a technique found by the inventors, when (A) the cyanate ester group compound and (B) the monovalent phenolic group compound were reacted in a solvent solution of polyphenylene ether resin, a uniform resin solution could be manufactured by forming a so-called "semi-IPN (interpenetrating polymer network) resin".

The flame retardant used in the resin composition of the present invention must be not reactive with the cyanate ester group compound so as not to interfere with the reaction between (A) the cyanate ester group compound and (B) the monovalent phenolic group compound. Such a flame retardant is an alicyclic flame retardant (aliphatic ring type flame retardant) which is a hydrocarbon group low polar composition and accordingly it hardly deteriorates the dielectric property of the cured material. Further, another kind of specified flame retardant is easily miscible with cyanate ester resin cured material because the specified flame retardant has a triazine structure similar to the cyanate ester cured material, and the specified flame retardant can give a flame retardant effect to the cyanate ester cured material without deteriorating the heat resistance and the dielectric property.

(A) A modified cyanate ester group curable resin composition in accordance with the present invention comprises (A) a cyanate ester group compound expressed by the chemical formula (1), (B) a monovalent phenolic group compound expressed by the chemical formula (2) or an alkyl substituted phenolic compound expressed by the chemical formula (3), (C) a polyphenylene ether resin, (D) a flame retardant not reactive with the cyanate ester group compound and (E) a metal group reaction catalyst, as essential components.

In accordance with the present invention, (A) the cyanate ester group compound is a cyanate ester group compound having two cyanate groups in one molecule as expressed by the chemical formula (1). The chemical compounds expressed by the chemical formula (1) are, for example, bis(4-cyanato-phenyl)ethane; 2,2-bis(4-cyanato-phenyl) propane; bis(3,5-dimethyl-4-cyanato-phenyl)methane; 2,2-bis(4-cyanato-phenyl)-1,1,1,3,3,3-hexafluoropropane; α,α'-bis(4-cyanato-phenyl)-m-diisopropylbenzen; a cyanate ester compound of phenol added dicyclopentadiene polymer; and the like. Among them, any one or a mixture of 2,2-bis(4-cyanato-phenyl)propane and bis(3,5-dimethyl-4-cyanato-phenyl)methane is preferable, because a balance between the dielectric property and the moldability of their cured material is particularly desirable. The (A) the cyanate ester group compounds can be used as a single kind or a mixture of two or more kinds.

In accordance with the present invention, (B) the monovalent phenolic group compound is a monovalent phenolic group compound expressed by the chemical formula (2) or an alkyl substituted phenolic compound expressed by the chemical formula (3), and a compound having desirable heat resistance is preferable. The chemical compound expressed by the chemical formula (2) is, for example, p-(α-cumyl) phenol, and the chemical compounds expressed by the chemical formula (3) are, for instance, p-tert-butylphenol, p-tert-amylphenol, and p-tert-octylphenol. (B) the monovalent phenolic group compounds can be used by a single kind or a mixture of two or more kinds.

The added quantity of (B) the monovalent phenolic group compound in the present invention is desirably 4 to 30 parts by weight to 100 parts by weight of (A) the cyanate ester group compound, preferably 5 to 30 parts by weight, and more preferably 4 to 25 parts by weight. When the added quantity of (B) the monovalent phenolic group compound is not more than 4 parts by weight, a sufficient dielectric property cannot be attained, and the dissapation factor particularly in a high frequency band is generally not decreased sufficiently. On the other hand, when the added quantity of (B) the monovalent phenolic group compound exceeds 30 parts by weight, the dissapation factor becomes rather high. This is not preferable. Therefore, in order to obtain a cyanate ester group resin cured material having a low dissapation factor in a high frequency band provided by the present invention, an appropriate quantity of (B) the monovalent phenolic group compound must be added to (A) the cyanate ester group compound.

In accordance with the present invention, (A) the cyanate ester group compound and (B) the monovalent phenolic group compound are used as the modified cyanate ester resin which is manufactured by reacting them. That is, they are used as a pre-polymer of (A) the cyanate ester group compound and imide-carbonated modified resin formed by adding (B) the monovalent phenolic group compound to (A) the cyanate ester group compound.

When (A) the cyanate ester group compound is reacted with (B) the monovalent phenolic group compound, the modified cyanate ester resin can be manufactured by adding all the appropriate quantity of (B) the monovalent phenolic group compound to be reacted from the beginning of the reaction, or the modified cyanate ester resin can be manufactured by adding a part of the appropriate quantity of (B) the monovalent phenolic group compound at an initial stage of the reaction, and after cooling, adding the remaining amount of (B) the monovalent phenolic group compound at B-stage reacting time or curing time.

In accordance with the present invention, (C) the polyphenylene ether resins are, for example, an alloyed polymer of poly(2,6-dimethyl-1,4-phenylene)ether, or poly(2,6-dimethyl-1,4-phenylene)ether, with polystyrene, an alloyed polymer of poly(2,6-dimethyl-1,4-phenylene)ether with styrene-butadiene copolymer, and the like. Particularly, the alloyed polymer of poly(2,6-dimethyl-1,4-phenylene)ether with polystyrene or styrene-butadiene copolymer and the alloyed polymer of poly(2,6-dimethyl-1,4-phenylene)ether with styrene-butadiene copolymer are desirable. A polymer containing the alloyed polymer of poly(2,6-dimethyl-1,4-phenylene)ether of more than 50% by weight is desirable, because the dielectric property of the cured material is desirable, and more than 65% by weight is particularly preferable.

The added quantity of (C) the polyphenylene ether resin in the present invention is desirably 5 to 300 parts by weight to 100 parts by weight of (A) the cyanate ester group compound, preferably 10 to 200 parts by weight, and more preferably 15 to 100 parts by weight. When the adding quantity of (C) the polyphenylene ether resin is not more than 5 parts by weight, a sufficient dielectric property cannot attained. On the other hand, when the added quantity of (C) the polyphenylene ether resin exceeds 300 parts by weight, the moldability is deteriorated, because the molten viscosity becomes high and the fluidity becomes low, and the reactivity with (A) the cyanate ester group compound is also deteriorated.

In accordance with the present invention, (D) examples of the flame retardant not reactive with the cyanate ester group compounds are, for example, 1,2-dibromo-4-(1,2-dibromoethyl)cyclohexane, tetrabromocyclohexane, hexabromocyclododecane, polybromodiphenylether, polystyrene bromide, polycarbonate bromide, and triphenylcyanate bromide group flame retardants expressed by the chemical formula (4), and the like. Particularly, 1,2-dibromo-4-(1,2-dibromoethyl)cyclohexane; tetrabromocyclooctane; hexabromocyclododecane; 2,4,6-tris(tribromophenoxy)-1,3,5-triazine are desirable, because the manufactured cured materials have preferable dielectric properties.

Formula (4)

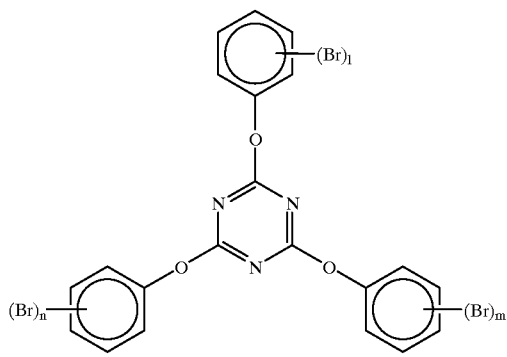

(where, respective of l, m, and n is an integer of 1 to 5, and the integers can be the same or different from each other.)

The added quantity of (D) the flame retardant not reactive with the cyanate ester group compounds of the present invention is desirably 5 to 30 parts by weight to 100 parts by weight of the total of (A) the cyanate ester group compound, (B) the monovalent phenolic group compound and (C) the polyphenylene ether resin, and preferably 5 to 20 weight part, and further preferably 10 to 20 parts by weight. When the added quantity of (D) the flame retardant not reactive with the cyanate ester group compound is not more than 5 parts by weight, the flame retardant effect is insufficient. When the added quantity of (D) the flame retardant exceeds 30 parts by weight, the heat resistance of the resin is decreased.

In accordance with the present invention, (E) the metal group reaction catalyst accelerates the reaction between (A) the cyanate ester group compound and (B) the monovalent phenolic group compound, and is used as the reaction catalyst in manufacturing the modified cyanate ester group curable resin composition and as the curing accelerator in manufacturing the laminated board. The metal group reaction being used are metallic catalysts such as manganese, iron, cobalt, nickel, copper, and zinc. Practically, the catalysts are used as an organic acid metal salt compound such as 2-ethylhexanoic salts, naphthenic salts, and as an organic metal complex such as acetylacetone complex. The same kind of the metal group reaction catalyst can be solely used or two or more kinds of the metal group reaction catalysts can be respectively used as the reaction catalyst in manufacturing the modified cyanate ester group curable resin composition and as the curing accelerator in manufacturing the laminated board.

The added quantity of (E) the metal group reaction catalyst of the present invention is desirably 1 to 300 ppm to 1 (g) of (A) the cyanate ester group compound, preferably 1 to 200 ppm, and more preferably 2 to 150 ppm. When the added quantity of (E) the metal group reaction catalyst is not more than 1 ppm, the reactivity and the curability become insufficient. On the other hand, when the added quantity exceeds 300 ppm, the reaction becomes difficult to control and the moldability is deteriorated, because the curing speed becomes too fast to be controlled. The timing for adding (E) the metal group reaction catalyst of the present invention can be at the time of manufacturing the modified cyanate ester group curable resin composition when the necessary quantity of the metal group reaction catalyst as a reaction accelerator and a curing accelerator is added together at one time, or at the time of manufacturing the modified cyanate ester group curable resin composition when the quantity of the metal group reaction catalyst necessary for accelerating the denaturalizing reaction is added and then at the time after completion of the reaction when the remaining catalyst or the other metallic catalyst is added and mixed as a curing accelerator.

An inorganic filler and other additives other than the above-mentioned essential components can be added to the modified cyanate ester group curable resin composition of the present invention. The usable fillers are silica, alumina, aluminum hydride, calcium carbonate, clay, talk, silicon nitride, boron nitride, titanium oxide, barium titanate, lead titanate, strontium titanate and the like. In accordance with the present invention, the quantity to be added is preferably less than 250 parts by weight to 100 parts by weight of the total resin composition, in order to obtain a uniform distribution in the adhered quantity of the resin and a desirable appearance when the resin varnish of the present invention is impregnated into the supporting material such as glass cloth.

The modified cyanate ester group curable resin composition of the present invention is used in manufacturing flame retardant films, films, other varnishes, prepregs for laminated board, and metal clad laminated boards, for example, in a manner as described below. That is, initially, the prepreg is manufactured by dissolving or suspending the modified cyanate ester group curable resin composition of the present invention into a solvent to form a varnish, impregnating the varnish into a base material such as glass cloth, and then drying the impregnated base material. Next, the metal clad laminated board with metallic films on both side surfaces or with a metallic film on one side surface is manufactured by laminating one or an arbitrary number of sheets of the prepreg, laminating metallic films on both sides surfaces or on one side surface of the laminated prepreg; and then heating and pressurizing the laminated prepreg. The flame retardant films and films can be manufactured by semi-curing or curing the modified cyanate ester group curable resin composition of the present invention.

Practical examples of the solvents used for making the varnish of the modified cyanate ester group curable resin composition in accordance with the present invention are an aromatic hydrocarbon having a boiling point in the range of 70–170° C. such as benzene, toluene, xylene and the like, a hydrocarbon halide such as trichloroethylene, chlorobenzene, and the like, an amide group such as N,N-dimethyl formaldehyde, N,N-dimethylacetoamide, and the like, and nitrogen group solvents such as N-methylpyrolidone and the like. Particularly, aromatic hydrocarbon such as benzene, toluene, xylene, and the like are desirable. These solvents can be used as solely one kind or by mixing two or more kinds. The added quantity of the aromatic hydrocarbon is desirably 150 to 500 parts by weight to 100 parts by weight of (C) the polyphenylene ether resin, preferably 150 to 400 parts by weight, and more preferably 150 to 300 parts by weight.

Ketones having a boiling point in the range of 50–170° C. such as acetone, methylethylketone, methy-lisobutylketone, cyclohexanone, and the like have a low solubility to the modified cyanate ester group curable resin composition, but have such an advantage that when the ketones are used together with the above-mentioned solvents, a high density and low viscosity solution can be manufactured by forming a suspension of the resin composition in accordance with the present invention. From this viewpoint, the solvents used for making the varnish of the modified cyanate ester group curable resin composition in accordance with the present invention are desirably mixed solvents of an aromatic hydrocarbon such as benzene, toluene, xylene, and the like, with ketones such as acetone, methylethylketone, methy-lisobutylketone, cyclohexanone, and the like. The quantity of the ketone to be added is desirably 50 to 500 parts by weight to 100 parts by weight of the organic hydrocarbon group solvent, preferably 50 to 400 parts by weight, and more preferably 50 to 300 parts by weight.

BRIEF DESCRIPTION OF THE DRAWINGS

No drawings.

DETAILED DESCRIPTION OF THE PREFERRED EMBODIMENTS

Hereinafter, details of the present invention will be explained referring to preferred embodiments.

The modified cyanate ester group curable resin composition varnishes were manufactured in accordance with the compositions indicated in Table 1.

Embodiment 1

Toluene 450 g, and PKN 4752 (a trade name of a product of Japan GE Plastic Co.) 210 g as (C) a polyphenylene ether resin were charged into a 5-liter 4-nozzle separable flask provided with a thermometer, a cooling pipe, and the mixture was a stirrer, and the mixture was heated to 80° C. with stirring so as to be dissolved. Next, 2,2-bis(4-cyanatophenyl)propane (Arocy B-10, a trade name of a product of Asahi Ciba Co.) 700 g as (A) the cyanate ester group compound; p-($\alpha$-cumyl)phenol (a product of Sun Technochemical Co.) 64 g as (B) the monovalent phenolic group compound; triphenylcyanulate bromide (Pyroguard SR-245, a trade name of a product of Dai-ichi Industrial Chemical Co.) 135 g as (D) the flame retardant not reactive with the cyanate ester group compounds were charged into the separable flask so as to be dissolved, and then 4 g of a toluene solution of 10% by weight of cobalt naphthenate (content of Co=8% by weight, a product of Japan Chemical Industry Co.) was added to the reaction liquid at a reflux temperature for 1 hour. Subsequently, the reaction liquid was cooled. When the inner temperature became 90° C., methyl ethyl ketone (MEK) 600 g was charged into the separable flask with stirring to form a suspension. After further cooling the reaction liquid to room temperature, 1 g of a toluene solution of 10% by weight zinc naphthenate (content of Zn=8% by weight, a product of Japan Chemical Industry Co.) was added and dissolved by stirring to obtain a varnish (solid content=51 weight %)

Embodiment 2

Toluene 300 g and polyphenylene ether resin (PKN 4752, a trade name of a product of Japan GE Plastic Co.) 140 g were charged into a 5-liter 4-nozzle separable flask provided with a thermometer, a cooling pipe and the mixture was a stirrer, and the mixture was heated to 80° C. so as to be dissolved with stirring. Subsequently, 2,2-bis(4-cyanatophenyl)propane (Arocy B-10, a trade name of a product of Asahi Ciba Co.) 700 g; p-($\alpha$-cumyl)phenol (a product of Sun Technochemical Co.) 10 g; triphenylcyanulate bromide (Pyroguard SR-245, a trade name of a product of Dai-ichi Industrial Chemical Co.) 125 g were charged into the separable flask so as to be dissolved, and then 3 g of a toluene solution of 10% by weight manganese naphthenate (content of Mn=8% by weight, a product of Japan Chemical Industry Co.) was added to the reaction liquid at a reflux temperature for 1 hour. Subsequently, the reaction liquid was cooled. When the inner temperature became 90° C., methyl ethyl ketone (MEK) 600 g was charged into the separable flask with stirring to form a suspension. After further cooling the reaction liquid to room temperature, 75 g of pi-($\alpha$-cumyl)phenol and 1 g of a toluene solution of 10% by weight zinc naphthenate (content of Zn=8% by weight, a product of Japan Chemical Industry Co.) was added and dissolved with stirring to obtain a varnish (solid content =8% by weight).

Embodiment 3

Toluene 300 g and polyphenylene ether resin (PKN 4752, a trade name of a product of Japan GE Plastic Co.) 80 g were charged into a 5-liter 4-nozzle separable flask provided with a thermometer, a cooling pipe, and the mixture was a stirrer, and the mixture was heated to 80° C. with stirring so as to be dissolved. Subsequently, α,α'-bis(4-cyanatophenyl)-m-diisopropylbenzen (RTX-366, a trade name of a product of Asahi Ciba Co.) 800 g; and p-(α-cumyl)phenol (a product of Sun Technochemical Co.) 10 g were charged into the separable flask so as to be dissolved, and then 2 g of a toluene solution of 10% by weight iron naphthenate (content of iron=5% by weight, a product of Japan Chemical Industry Co.) was added to the reaction liquid at a reflux temperature for 1 hour. Then, tetrabromocyclooctane (Saytex BC-48, a trade name of a product of Albemarl Co.) 110 g was added into the flask and dissolved. Subsequently, the reaction liquid was cooled. When the inner temperature became 90° C., methyl ethyl ketone (MEK) 600 g was charged into the separable flask with stirring to form a suspension. After further cooling the reaction liquid to room temperature, 75 g of p-(α-cumyl)phenol and 2 g of a toluene solution of 10% by weight copper naphthenate (content of copper=8% by weight, a product of Japan Chemical Industry Co.) were added into the flask and dissolved with stirring to obtain a varnish (solid content=54% by weight).

Embodiment 4

Toluene 600 g and polyphenylene ether resin (PKN 4752, a trade name of a product of Japan GE Plastic Co.) 300 g were charged into a 5-liter 4-nozzle separable flask provided with a thermometer, a cooling pipe, and the mixture was a stirrer, and heated to 80° C. with stirring so as to be dissolved. Next, bis(3,5-dimethyl-4-cyanato-phenyl) methane (Arocy M-10, a trade name of a product of Asahi Ciba Co.) 600 g; and p-(α-cumyl)phenol (a product of Sun Technochemical Co.) 30 g were charged into the separable flask so as to be dissolved, and then 4 g of a toluene solution of 10% by weight cobalt naphthenate (content of Co=8% by weight, a product of Japan Chemical Industry Co.) was added to the reaction liquid at a reflux temperature for 1 hour; and then hexabromocyclododecane (CD-75P, a trade name of a product of Grate Lakes Co.) 150 g was added into the flask and dissolved. Subsequently, the reaction liquid was cooled. When the inner temperature became 90° C., methyl ethyl ketone (MEK) of 750 g was charged into the separable flask with stirring to form a suspension. After further cooling the reaction liquid to room temperature, 120 g of p-(α-cumyl)phenol was added and dissolved with stirring to obtain a varnish (solid content=47% by weight).

Embodiment 5

Toluene 750 g and polyphenylene ether resin (PKN 4752, a trade name of a product of Japan GE Plastic Co.) 400 g were charged into a 5-liter 4-nozzle separable flask provided with a thermometer, a cooling pipe and the mixture was a stirrer, and the mixture was heated to 80° C. with stirring so as to be dissolved. Next, 2,2bis(4-cyanatophenyl)-1,1,1,3,3,3-hexafluoropropane (Arocy F-10, a trade name of a product of Asahi Ciba Co.) 500 g; and p-(α-cumyl)phenol (a product of Sun Technochemical Co.) 28 g were charged into the separable flask to be dissolved, and then 6 g of a toluene solution of 10% by weight copper naphthenate (content of Cu=5% by weight, a product of Japan Chemical Industry Co.) was added to the reaction liquid at a reflux temperature for 1 hour; and then, 1,2-dibromo-4-(1,2-dibromoethyl)cyclohexane (Saytex BCL-462, a trade name of a product of Albemarl Co.) 150 g was added into the flask and dissolved. Then, the reaction liquid was cooled. When the inner temperature became 90° C., methyl ethyl ketone (MEK) 500 g was charged into the separable flask with stirring to form a suspension. After further cooling the reaction liquid to room temperature, 1 g of a toluene solution of 10% by weight manganese naphthenate (content of Mn=8% by weight, a product of Japan Chemical Industry Co.) was added into the flask and dissolved with stirring to obtain a varnish (solid content=46% by weight).

Embodiments 6–10

The varnishes in the embodiment 6–10 were manufactured by the same method under the same condition as described in the above embodiments 1–5 except only for replacing the component (B) the monovalent phenolic group compound with the compounds indicated in the embodiments 6–10 of Table 1, respectively.

Comparative Example 1

Toluene 1800 g, polyphenylene ether resin (PKN 4752, a trade name of a product of Japan GE Plastic Co.) 210 g, 2,2-bis(4-cyanato-phenyl)propane (Arocy B-10, a trade name of a product of Asahi Ciba Co.) 700 g, and 2,2-bis(4-hydroxyphenyl)propane (BPA; bisphenol A, a product of Mitsui Toatsu Chemicals, Inc.) 69 g instead of p-(α-cumyl)phenol in the embodiment 1, were charged into the separable flask, and were stirred to be dissolved. Then, 3 g of a toluene solution of 10% by weight cobalt naphthenate (content of Co=8% by weight, a product of Japan Chemical Industry Co.) was added to the reaction liquid at a reflux temperature for 1 hour. Next, bromated bisphenol A type epoxy resin (ESB 400, a trade name of a product of Sumitomo Chemicals Co., Ltd.) 200 g as a flame retardant reactive with cyanate group was charged into the separable flask to be dissolved, and the reaction liquid was cooled. However, because the reaction liquid was solidified (into a grease state) near room temperature, toluene of 1200 g was further added and was stirred to dissolve the reaction product to obtain a varnish (solid content=28% by weight).

Comparative Example 2

Toluene 1800 g, polyphenylene ether resin (PKN 4752, a trade name of a product of Japan GE Plastic Co.) 210 g, 2,2-bis(4-cyanato-phenyl)propane (Arocy B-10, a trade name of a product of Asahi Ciba Co.) 700 g, and nonylphenol (a product of Mitsui Toatsu Chemicals, Inc.) 11 g instead of p-(α-cumyl)phenol in the embodiment 1 were charged into the separable flask, and were stirred so as to be dissolved. Then, 4 g of a toluene solution of 10% by weight cobalt naphthenate (content of Co=8 $ by weight, a product of Japan Chemical Industry Co.) was added to the reaction liquid at a reflux temperature for 1 hour. Next, bromated bisphenol A type epoxy resin (ESB 400, a trade name of a product of Sumitomo Chemicals Co., Ltd.) 190 g as a flame retardant reactive with cyanate group was charged into the separable flask to be dissolved, and the reaction liquid was cooled. However, because the reaction liquid was solidified (into a grease state) near room temperature, toluene 900 g was further added and was stirred to dissolve the reaction product to obtain a varnish (solid content=29% by weight).

Comparative Example 3

Toluene 1500 g, and polyphenylene ether resin (PKN 4752, a trade name of a product of Japan GE Plastic Co.) 210 g were charged into the separable flask, and were stirred so as to be dissolved. Next, an oligomer of 2,2-bis(4-cyanatophenyl)propane (Arocy B-30, a trade name of a product of Asahi Ciba Co.) 700 g instead of 2,2-bis(4-cyanato-phenyl)propane (Arocy B-10, a trade name of a product of Asahi Ciba Co.) in the embodiment 1; nonylphenol (a product of Mitsui Toatsu Chemicals, Inc.) 67 g instead of p-(α-cumyl)phenol; and bromated bisphenol A type epoxy resin (ESB 400, a trade name of a product of Sumitomo Chemicals Co., Ltd.) 200 g as a flame retardant reactive with cyanate group were let into the separable flask; were charged into the flask, heated and dissolved at 80° C. for 1 hour. Then, the reaction liquid was cooled to room temperature, and 2 g of a toluene solution of 10% by weight zinc naphthenate (content of Zn=8% by weight, a product of Japan Chemical Industry Co.) was added into the flask to obtain a varnish (solid content=44% by weight). However, flocculated separation of polyphenylene ether resin was observed in the resin varnish after two days elapsed.

Comparative Example 4

In embodiment 4, toluene 1600 g, polyphenylene ether resin (PKN 4752, a trade name of a product of Japan GE Plastic Co.) 300 g, bis(3,5-dimethyl-4-cyanatophenyl) methane (Arocy M-10, a trade name of a product of Asahi Ciba Co.) 600 g, and nonylphenol of 9 g instead of p-(α-cumyl)phenol (a product of Sun Techno Chemical Co.) were charged into the separable flask, and were stirred so as to be dissolved. Then, 3 g of a toluene solution of 10% by weight manganese naphthenate (content of Mn=8% by weight, a product of Japan Chemical Industry Co.) was added to the reaction liquid at a reflux temperature for 1 hour. Next, tetrabromobisphenol A (Fire Guard FG-2000, a trade name of a product of Teijin Chemicals Co., Ltd.) 150 g as a flame retardant reactive with cyanate group was charged into the separable flask so as to be dissolved, and the reaction liquid was cooled. However, because the reaction liquid was solidified (into a grease state) near room temperature, toluene 1200 g was further added and was stirred to dissolve the reaction liquid to obtain a varnish (solid content=27% by weight).

TABLE 1

| Emb[1)] | (A) Cyanate ester Com.[2)] | Mix.[3)] | (B) Monovalent phenol Com. | Mix. | (C) Polyphenylene ether Com. | Mix. | (D) Flame retardant Com. | Mix. | (E) Metallic reaction catalyst Com. | Mix. |
|---|---|---|---|---|---|---|---|---|---|---|
| 1 | B-10 | 700 | PCP | 64 | PPO | 210 | SR-245 | 135 | Co | 4 |
|   |      |     |     |    |     |     |        |     | Zn | 1 |
| 2 | B-10 | 700 | PCP | 10 | PPO | 140 | SR-245 | 125 | Mn | 3 |
|   |      |     | PCP | 75 |     |     |        |     | Zn | 1 |
| 3 | RTX-366 | 800 | PCP | 10 | PPO | 80 | BC-48 | 110 | Fe | 2 |
|   |      |     | PCP | 75 |     |     |        |     | Cu | 2 |
| 4 | M-10 | 600 | PCP | 30 | PPO | 300 | CD-75P | 150 | Co | 4 |
|   |      |     | PCP | 120 |    |     |        |     |    |   |
| 5 | F-10 | 500 | PCP | 28 | PPO | 400 | BCL-462 | 150 | Cu | 6 |
|   |      |     |     |    |     |     |        |     | Mn | 1 |
| 6 | B-10 | 700 | POP | 62 | PPO | 210 | SR-245 | 135 | Co | 4 |
|   |      |     |     |    |     |     |        |     | Zn | 1 |
| 7 | B-10 | 700 | POP | 10 | PPO | 140 | SR-245 | 125 | Mn | 3 |
|   |      |     | POP | 73 |     |     |        |     | Zn | 1 |
| 8 | RTX-366 | 800 | PBP | 10 | PPO | 80 | BC-48 | 110 | Fe | 2 |
|   |      |     | PBP | 51 |     |     |        |     | Cu | 2 |
| 9 | M-10 | 600 | POP | 30 | PPO | 300 | CD-75p | 150 | Co | 4 |
|   |      |     | POP | 115 |    |     |        |     |    |   |
| 10 | F-10 | 500 | PAP | 21 | PPO | 400 | BCL-462 | 150 | Cu | 6 |
|    |      |     |     |    |     |     |        |     | Mn | 1 |
| C-1[4)] | B-10 | 700 | BPA | 69 | PPO | 210 | ESB-400 | 200 | Co | 3 |
| C-2 | B-10 | 700 | NP | 11 | PPO | 210 | ESB-400 | 190 | Co | 4 |
| C-3 | B-10 | 700 | NP | 67 | PPO | 210 | ESB-400 | 200 | Zn | 2 |
| C-4 | M-10 | 600 | NP | 9 | PPO | 300 | TBA | 150 | Mn | 3 |

Remarks:
[1)]Emb; Embodiment number
[2)]Com.; Kind of compound
[3)]Mix.; Mixing ratio (parts by weight)
[4)]C-; Comparative example number
(A) B-10 (a product of Asahi Ciba Co.); 2,2-bis(4-cyanatophenyl) propane
  M-10 (a product of Asahi Ciba Co.); bis(3,5-dimethyl-4-cyanatophenyl) methane
  F-10 (a product of Asahi Ciba Co.); 2,2 bis(4-cyanatophenyl)-1,1,1,3,3,3-hexafluoropropane
  RTX-366 (a product of Asahi Ciba Co.); α,α'-bis(4-cyanatophenyl)-m-diisopropylbenzen

TABLE 1-continued (B) PCP (a product of Sun Technochemical Co.); p-(α-cumyl) phenol
BPA (bisphenol A, a product of Mitsui Toatsu Chemicals, Inc.); 2,2-bis(4-hydroxyphenyl) propane
Np (a product of Mitsui Toatsu Chemicals, Inc.); nonylphenol
PBP (a product of Wako Pure chemical Co.); p-tert-bytulphenol
PAP (a product of Wako Pure chemical Co.); p-tert-amylphenol
POP (a product of Wako Pure chemical Co.); p-tert-octylphenol
(C) PPO (PKN 4752, a trade name of a product of Japan GE Plastic Co.); polyphenylene ether
(D) BCL-462 (a trade name of a product of Albemarl Co.); 1,2-dibromo-4-(1,2-dibromoethyl) cyclohexane
BC-48 (a trade name of a product of Albemarl Co.); tetrabromo-cyclooctane
CD-75P (a trade name of a product of Grate Lakes Co.); hexabromo-cyclododecane
SR-245 (a trade name of a product of Dai-ichi Industrial Chemical Co.); 2,4,6-tris(tribromophenoxy)-1,3,5-tryazine
ESB-400 (a trade name of a product of Sumitomo Chemicals Co., Ltd.); bromated bisphenol A type epoxy resin
TBA (FG-2000, a trade name of a product of Teijin Chemicals Co., Ltd.); tetrabromobisphenol A
(E) Co; toluene solution of 10% by weight cobalt naphthenate (content of Co = 8% by weight, a product of Japan Chemical Industry Co.)
Zn; toluene solution of 10% by weight zinc naphthenate (content of Zn = 8% by weight, a product of Japan Chemical Industry Co.)
Mn; toluene solution of 10% by weight manganese naphthenate (content of Mn = 8% by weight, a product of Japan Chemical Industry Co.)
Fe; toluene solution of 10% by weight iron naphthenate (content of Fe = 5% by weight, a product of Japan Chemical Industry Co.)
Cu; toluene solution of 10% by weight copper naphthenate (content of Cu = 5% by weight, a product of Japan Chemical Industry Co.)

A prepreg having an adhered resin, of which the quantity was 40 to 45% by weight, was manufactured by impregnating an E glass cloth having a thickness of 0.2 mm (weight 209 g/m$^2$) with the manufactured resin varnish and heating it at 140° C. for 5 to 10 minutes (so that the gelling time (170° C.) became 5 to 7 minutes). In the cases of the resin varnish of comparative examples 1, 2, and 4, the prepregs having an adhered resin, of which the quantities were in the range of 40 to 45% by weight, were manufactured by repeating the impregnation applying work twice, because the solid content was low. In the prepreg of comparative example 3, separation between the cyanate ester resin and the polyphenylene ether resin was observed.

Next, laminated boards with copper foil were manufactured by laminating four prepregs and copper foils having a thickness of 18 μm on both sides, pressurizing the boards to form the laminated board under a condition of 170° C., 2.5 MPa for 60 minutes, and then performing a heat treatment at 230° C. for 120 minutes. Using the manufactured laminated boards with copper foil, the dielectric property, the resistance to heated solder, the peeling strength of the copper foil and the flame retardant property were measured in accordance with the following methods. The results are shown in Table 2.

(Methods of Evaluating Properties)

Specific dielectric constant and dissapation factor/1 GHz: the properties were measured through the tri-plate structure straight wiring resonance method.

Resistance to heated solder: an outer appearance was inspected by holding a test piece, of which the copper foils were removed, in a PCT (12120 C., 0.22 MPa), and then immersing the test piece into a molten solder at 260° C. for 20 seconds. In the table, "OK" means no occurrence of measling nor swelling, and "NG" means occurrence of measling and swelling.

Peeling strength of copper foil: Measurement was performed in accordance with JIS-C-6481.

Flame retardant resistance: Measurement was performed in accordance with UL-94 Vertical Test Method.

TABLE 2

| Emb[1] | Dielect.[2] prop./1 GHz. | | Solder[3]. heat res. | P.S.[4] of Cu foil | Flame retard.[5] | Remarks: Sol. ct.[6] |
|---|---|---|---|---|---|---|
| | D.c. | D.f. | 260° C., 20 s. | (kN/m) | UL-94 | of v. (%) |
| 1 | 3.5 | 0.0045 | PCT 4h OK | 1.5 | V–0 | 51 |
| 2 | 3.5 | 0.0048 | PCT 4h OK | 1.7 | V–0 | 54 |
| 3 | 3.3 | 0.0038 | PCT 4h OK | 1.7 | V–0 | 54 |
| 4 | 3.4 | 0.0042 | PCT 3h OK | 1.4 | V–0 | 47 |
| 5 | 3.3 | 0.0039 | PCT 3h OK | 1.3 | V–0 | 46 |
| 6 | 3.5 | 0.0045 | PCT 4h OK | 1.5 | V–0 | 51 |
| 7 | 3.5 | 0.0048 | PCT 3h OK | 1.7 | V–0 | 54 |
| 8 | 3.3 | 0.0040 | PCT 3h OK | 1.6 | V–0 | 54 |
| 9 | 3.4 | 0.0043 | PCT 3h OK | 1.4 | V–0 | 47 |
| 10 | 3.3 | 0.0041 | PCT 3h OK | 1.3 | V–0 | 46 |
| C-1 | 3.9 | 0.0106 | PCT 2h OK | 1.4 | V–0 | 28 (apply twice) |
| C-2 | 3.9 | 0.0092 | PCT 2h OK | 1.4 | V–0 | 29 (apply twice) |
| C3 | 3.8 | 0.0099 | PCT 1h OK | 1.1 | V–0 | 44 (PPO separated) |
| C4 | 3.8 | 0.0088 | PCT 1h OK | 1.3 | V–0 | 27 (apply twice) |

Remarks:
[1]Emb.: Embodiment number
[2]Dielect. prop./1 Ghz: Dielectric properties/1 Ghz.
D.c.: Dielectric constant

TABLE 2-continued

|  | Dielect.[2] prop./1 GHz. | | Solder[3]. heat res. | P.S.[4] of Cu foil | Flame retard.[5] | Remarks: Sol. ct.[6] |
|---|---|---|---|---|---|---|
| Emb[1] | D.c. | D.f. | 260° C., 20 s. | (kN/m) | UL-94 | of v. (%) |

D.f.: Dissapation factor
[3] Solder. heat res.: Soldering heat resistance
[4] P.S. of Cu foil: Peeling strength of copper foil
[5] Flame retard.: Flame retardant
[6] Sol. ct. of v.: Solid content of varnish It is clear from Table 2 that all the laminated boards using the modified cyanate ester group curable resin compositions of embodiments 1 to 10 have a low dielectric constant, a low dissapation factor at 1 GHz, a desirable soldering heat resistance with absorbed moisture, and a desirable peeling strength of the copper foil. On the contrary, the laminated boards of the comparative examples have a high dielectric constant, a high dissapation factor at 1 GHz, and a low heat resistance.

Embodiments 11–18, Comparative Examples 5–7

In accordance with the same method as the embodiment, a modified cyanate ester group curable resin composition varnish was manufactured with the composition indicated as embodiment 11 in Table 3.

Toluene 360 g, and polyphenylene ether resin (nonylPKN 4752, a trade name of a product of Japan GE Plastic Co.) 160 g were charged into a 1-liter 4-nozzle separable flask provided with a thermometer, a cooling pipe, and the mixture gas a stirrer, and the mixture gas heated to 80° C. with stirring so as to be dissolved. Next, after charging 2,2-bis (4-cyanatophenyl)propane (Arocy B-10, a trade name of a product of Asahi Ciba Co.) 80 g, and p-(α-cumyl)phenol (a product of Sun Technochemical Co.) 2 g into the flask so as to be dissolved, 0.3 g of a toluene solution of 10% by weight of manganese naphthenate (content of Mn=8% by weight, a product of Japan Chemical Industry Co.) was added to the reaction liquid, and reacted at a reflux temperature for 3 hours. Then, tetrabromocyclooctane (Saytex BC-48, a trade name of a product of Albemarl Co.) 60 g was added into the flask and dissolved. Subsequently, the reaction liquid was cooled. When the inner temperature became 90° C., methyl ethyl ketone (MEK) 600 g was charged into the separable flask with stirring to form a suspension. After further cooling the reaction liquid to room temperature, p-(α-cumyl)phenol 6 g, and a toluene solution of 10% by weight zinc naphthenate (content of Zn=8% by weight, a product of Japan Chemical Industry Co.) 0.2 g were added and dissolved by stirring to obtain a modified cyanate ester group curable resin composition varnish (solid content=32 weight %).

Similarly, the modified cyanate ester group curable resin composition varnish of embodiment 12 was manufactured using the composition indicated as embodiment 12 in Table 3.

Using the composition indicated as embodiment 13 in Table 3, the modified cyanate ester group curable resin composition varnish of embodiment 12 was manufactured.

Toluene 540 g, and polyphenylene ether resin (nonylPKN 4752, a trade name of a product of Japan GE Plastic Co.) 105 g were charged into a 1-liter 4-nozzle separable flask provided with a thermometer, a cooling pipe, and the mixture was a stirrer, and the mixture was heated to 80° C. with stirring so as to be dissolved. Next, after charging 2,2-bis (4-cyanatophenyl)propane (Arocy B-10, a trade name of a product of Asahi Ciba Co.) 75 g, p-(α-cumyl)phenol 15 g, and triphenylcyanulate bromide (Pyroguard SR-245, a trade name of a product of Dai-ichi Industrial Chemical Co.) 45 g into the flask so as to be dissolved, 0.7 g of a toluene solution of 10% by weight of cobalt naphthenate (content of Co=8% by weight, a product of Japan Chemical Industry Co.) was added to the reaction liquid, and reacted at a reflux temperature for 2 hours. After cooling the reaction liquid room temperature, a toluene solution of 10% by weight zinc naphthenate (content of Zn=8% by weight, a product of Japan Chemical Industry Co.) 0.1 g was added and dissolved by stirring to obtain a modified cyanate ester group curable resin composition varnish (solid content=31 weight %).

Similarly, the modified cyanate ester group curable resin composition varnish of embodiments 14–18, and the comparative examples 5, 7 were manufactured using the composition indicated in Table 3.

Using the composition indicated as comparative example 6 in Table 3, the modified cyanate ester group curable resin composition varnish of embodiment 12 was manufactured.

Methyl ethyl ketone (MEK) 240 g, 2,2-bis(4-cyanatophenyl)propane (Arocy B-10, a trade name of a product of Asahi Ciba Co.) 120 g, p-(α-cumyl)phenol 2 g, and 40 g of bromated bisphenol A type epoxy resin (ESB, a trade name of a product of Sumitomo Chemical Industries Co.), which was reactive with a cyanato group, as a flame retardant were charged into a 1-liter 4-nozzle separable flask provided with a thermometer, a cooling pipe, and a stirrer. After dissolving the charged chemicals with stirring, 1.2 g of a toluene solution of 10% by weight of cobalt naphthenate (content of Co=8% by weight, a product of Japan Chemical Industry Co.) was added to the reaction liquid, and reacted at a reflux temperature for 2 hours. Then, the reaction liquid was cooled to room temperature to obtain a varnish (solid content=40 weight %).

A resin film adhered with a film made of polyethylene terephthalate (PET) having a resin layer 30–33 μm thick was manufactured by applying the manufactured varnish, respectively, onto a film made of PET (Burex A-63, a trade name of a product made by Teijin Co.) of 50 μm thick with a releasing agent using a comma type coater (made by Hirano techseed Co.), a kind of bar coater, and dried at 130° C.

The manufactured modified cyanate ester group curable resin films of the embodiments 11–18, and the comparative example 5 had no resin cracks nor powder spilling even when the film was cut by a cutter-knife, and the films were found to be superior in handling properties.

On the contrary, resin cracks and powder spilling were generated when the resin film of the comparative example 6 was cut by a cutter-knife, and the resin film could not be handled if the resin film was separated from the PET film.

Separated coagulation of the polyphenylene ether resin was observed in the varnish of the comparative example 7 after a day elapsed, and no resin film could be manufactured.

TABLE 3

| Emb[1] | (A) Cyanate ester Com[2] | (A) Cyanate ester Mix[3] | (B) Monovalent phenol Com. | (B) Monovalent phenol Mix. | (C) Polyphenylene ether Com. | (C) Polyphenylene ether Mix. | (D) Flame retardant Com. | (D) Flame retardant Mix. | (E) Metallic reaction catalyst Com. | (E) Metallic reaction catalyst Mix. | Solid content wt % |
|---|---|---|---|---|---|---|---|---|---|---|---|
| 11 | B-10 | 80 | PCP | 2 | PPO | 160 | BC-48 | 60 | Mn | 0.3 | 32 |
|  |  |  | PCP | 6 |  |  |  |  | Zn | 0.2 |  |
| 12 | B-10 | 80 | POP | 2 | PPO | 160 | BC-48 | 60 | Mn | 0.3 | 32 |
|  |  |  | PBP | 5 |  |  |  |  | Zn | 0.2 |  |
| 13 | B-10 | 75 | PCP | 15 | PPO | 105 | SR-245 | 45 | Co | 0.7 | 31 |
|  |  |  |  |  |  |  |  |  | Zn | 0.1 |  |
| 14 | B-10 | 75 | POP | 15 | PPO | 105 | SR-245 | 45 | Co | 0.7 | 31 |
|  |  |  |  |  |  |  |  |  | Zn | 0.1 |  |
| 15 | B-10 | 90 | PCP | 11 | PPO | 90 | CD-75P | 35 | Mn | 0.7 | 30 |
| 16 | B-10 | 90 | POP | 11 | PPO | 90 | CD-75P | 35 | Mn | 0.7 | 30 |
| 17 | M-10 | 120 | PCP | 6 | PPO | 60 | BCL-462 | 30 | Mn | 0.4 | 29 |
|  |  |  |  |  |  |  |  |  | Co | 0.2 |  |
| 18 | M-10 | 120 | PAP | 6 | PPO | 60 | BCL-462 | 30 | Mn | 0.4 | 29 |
|  |  |  |  |  |  |  |  |  | Co | 0.2 |  |
| C-5[4] | — | — | — | — | PPO | 120 | BC-48 | 20 | — | — | 28 |
| C-6 | B-10 | 120 | PCP | 2 | — | — | ESB-400 | 40 | Co | 1.2 | 40 |
| C-7 | B-30 | 90 | NP | 1 | PPO | 90 | ESB-400 | 60 | Co | 1.0 | 29 |

Remarks:
[1] Emb; Embodiment number
[2] Com.; Kind of compound
[3] Mix.; Mixing ratio (parts by weight)
[4] C-; Comparative example number Next, the resin films adhered the PET film of the embodiments 11–18 were evaluated as to be handling properties of the resin film alone and the solvent-resistance of the cured film.

The PET film was peeled off from the adhered resin film adhered with the PET film of the embodiment 11. Twelve sheets of the manufactured resin film were piled up, and a mirror plane of electrolyzed copper foil was piled onto the respective upper plane and lower plane of the piled resin sheets as a peeling plane. Then, the piled sheets were pressurized with 1.5 MPa at 200° C. for 1 hour to form a cured film of the modified cyanate ester group resin of approximately 0.4 mm thickness. Similarly, the resin films of the embodiments 12–18 were pressurized to form respective cured resin films.

Regarding the resin film adhered with the PET film of the comparative example 5, the PET film was peeled off from the adhered resin film, twelve sheets of the manufactured resin film were piled up, and a mirror plane of electrolyzed copper foil was piled onto the respective upper plane and lower plane of the piled resin sheets as a peeling plane. Then, The piled sheets were pressurized with 1.5 MPa at 200° C. for 1 hour to form a cured film of the modified cyanate ester group resin of approximately 0.4 mm thickness.

A similar operation was performed on the resin film adhered with the PET film of the comparative example 6. However, the resin film adhered with the PET film of the comparative example 6 was a film made of only cyanate ester resin, and the resin film was broken when peeling of the PET film was attempted, because the resin film itself was brittle. Therefore, a cured film of the resin could not be manufactured.

The above cured resin film was cut up into pieces 50 mm square, immersed into toluene, and kept at room temperature for 60 minutes. No swelling nor changes in appearance could be observed on the cured resin films of the embodiments 11–18. Surfaces of the separately prepared cured resin films of the embodiments 11–18 were wiped several times with a cloth wetted with toluene or methyl ethyl ketone (MEK), and changes in appearance of the film were observed. However, no changes could be observed on the surface of the cured resin films of the embodiments 11–18.

Similarly, the cured resin film of the comparative example 5 was cut up into pieces 50 mm square, immersed into toluene, and kept at room temperature for 60 minutes. Swelling of the film was observed, because the cured resin film was made of only polyphenylene ether, and a part of the film was dissolved. When a surface of the separately prepared cured resin film was wiped several times with a cloth wetted with toluene, the surface of the film was dissolved, and became sticky. When a surface of the separately prepared cured resin film was wiped several times with a cloth wetted with methyl ethyl ketone (MEK), cracks were generated on the surface of the film, and finally the film was broken by generation of holes.

In accordance with the above results, it was confirmed that the modified cyanate ester group resin film of the present invention allowed handling by the film alone, and exhibited a preferable solvent-resistance.

Embodiments 19–26, and Comparative Example 8

Fused silica powder having an average particle size of 5 μm 25 g was added as an inorganic filler to 170 g of the modified cyanate ester group resin varnishes manufactured by the compositions indicated in Table 3; further, 200 g of ceramic beads 1.0 mm in diameter was added to the mixture, and the mixture was kneaded at 1500 rpm for one hour using a bead mill made by AIMEX Co. After the kneading, the beads were filtered off from the varnish, and a filler containing a cured resin film adhered with the PET film having a resin layer (including the filler) of 55–60 μm thickness was manufactured by the steps of applying the varnish onto a polyethylene terephthalate (PET) film (PUREX A=63, a trade name of a product made by Teijin Co.) of 50 μm in thickness having a releasing agent thereon using a comma type coater, a kind of bar coater, and was dried at 130° C.

Comparative Example 8

A modified cyanate ester group curable resin composition varnish (solid content=30% by weight) was manufactured by the same method as the embodiment 15 except for replacing the p-(α-cumyl)phenol in the embodiment 15 with 2 g of nonyl phenol (made by Mitsui Toatsu Chemical Co.), and adding and dissolving 45 g of tetrabromobisphenol A (Fire Guard FG-2000, a trade name of a product made by Teijin Chemicals Co.), which was reactive with the cyanato group, as a flame retardant. Using the above varnish, a filler containing a cured resin adhered with the PET film having a resin layer(including the filler) of 55–60 μm in thickness was manufactured by the steps of kneading fused silica powder with the varnish, and then applying and drying as same manner if in the embodiment 15. The manufactured resin film had no resin cracks nor powder spilling even when if the film was cut by a cutter-knife, and was superior in handling properties.

The PET film was peeled off from the adhered resin film adhered with the PET film of the embodiment 19. Twelve sheets of the manufactured filler containing resin film were piled up, and an electrolyzed copper foil 18 μm in thickness was piled onto the respective upper plane and the lower plane of piled resin sheets. The piled sheets were pressurized with 1.5 MPa at 200° C. for 1 hour to form a cured resin composition of approximately 0.6 mm thickness having copper foils at both ends. Similarly, the filler containing resin films adhered with the PET film of the embodiments 20–26 and the comparative example 8 were pressurized with electrolyzed copper foils 18 μm in thickness to form respective cured resin compositions having copper foils at both ends.

Next, triplates-line oscillators having a line length of approximately 200 mm were manufactured from these cured resin compositions having copper foils at both ends by chemical etching, and the dielectric constants and the dissapation factors at 1 GHz were manufactured by measuring transmission loss in the 1 GHz band using a network analyzer. The glass transition temperature (Tg) and the tensile elastic modulus/40° C. were measured in a tensile mode (frequency; 10 Hz, temperature rise; 5° C./min.) on the filler containing cured resin composition by removing the copper foil by etching, and cutting out test pieces, with a wide band viscosity-elasticity measuring apparatus (DVE, made by Rheology Co.). The manufactured results are indicated in Table 4.

TABLE 4

| Embodiment (comp.)[1] | Dielectric properties | | Glass trans. temp. (Tg) (° C.) | Tensile elasticity (MPa) |
| --- | --- | --- | --- | --- |
| | Diel. c.[2] | D. f.[3] | | |
| 19 (Emb. 11) | 2.7 | 0.0048 | 174 | 4700 |
| 20 (Emb. 12) | 2.7 | 0.0048 | 170 | 4690 |
| 21 (Emb. 13) | 2.7 | 0.0054 | 176 | 4790 |
| 22 (Emb. 14) | 2.7 | 0.0056 | 172 | 4800 |
| 23 (Emb. 15) | 2.8 | 0.0044 | 178 | 5410 |
| 24 (Emb. 16) | 2.8 | 0.0044 | 180 | 5400 |
| 25 (Emb. 17) | 2.8 | 0.0045 | 188 | 5590 |
| 26 (Emb. 18) | 2.8 | 0.0047 | 184 | 5550 |
| 27 (Emb. 19) | 3.3 | 0.0122 | 172 | 4240 |

Remarks:
1)Comp.; Composition
2)Diel. c.; Dielectric constant
3)D. f.; Dissapation factor It was confirmed that the filler containing resin film using the modified cyanate ester group resin film of the present invention had low dielectric properties in the Ghz band, particularly, a low dissapation factor because the cyanate ester group compounds reacted with the specified monovalent phenol group, a preferable glass transition temperature, which can be deemed as an index of heat resistance, and a mechanical strength.

Embodiments 27–29, Comparative Examples 9, 10

In accordance with the embodiments 27–29, respective copper foil clad resin films having a resin layer 60–70 μm in thickness was manufactured by applying respective modified cyanate ester group curable resin composition varnishes in the embodiments 11, 13, and 15 onto a roughened surface of the electrolyzed copper foil of 18 μm thickness using a comma type coater, a kind of coater, and drying. The manufactured resin film had no resin cracks nor powder spilling even when the film was cut by a cutter-knife, and was superior in handling properties.

Then, respective ones of a four layer printed circuit board were manufactured by the steps of piling up respective resin films having the copper foils of the embodiments 27–29 at both end planes of an inner circuit board (copper foil thickness for circuit: 18 μm), which was a copper plated epoxy resin laminated board having a glass cloth base material whereon a conductive circuit was formed, so as to contact respective resin layers with the inner circuit, and the pile was pressurized to form the four layer circuit board under a condition of 200° C., 2.5 MPa for 60 minutes.

Similarly, using the varnish of the comparative example 8, a copper foil clad resin film having a resin layer of 60–70 μm thickness was manufactured by the same method as the embodiments 27–29, and a four layer circuit board was manufactured similarly as the comparative example 9.

In accordance with comparative example 10, a four layer printed circuit board was manufactured by the steps of piling up respective ones of an epoxy resin prepreg (FR-4 grade) having a glass cloth base material for a multilayered circuit board having a nominal thickness of 70 μm, and a copper foil 18 μm in thickness was laminated at each of the end planes of the copper plated epoxy resin laminated board having a glass cloth base material, which was the same as the board used in the embodiments 27–29, and the pile was pressurized to form the four layer circuit board under a condition of 180° C., 2.5 MPa for 60 minutes.

Moldability (presence of voids and blur), soldering heat resistance, and the copper foil peeling strength of the four layer printed circuit boards manufactured by the embodiments 27–29, and the comparative examples 9 and 10, were evaluated by the following methods. The results are indicated in Table 5.

(Evaluating Methods of Characteristics)

Moldability: All of the outer layer copper foil of the four layer circuit board was removed by chemical etching, and the filling condition of the resin into the inner circuit (presence of voids and blurs) was observed by eye.

Soldering heat resistance: A four layer board 50 mm square with the outer layer copper foil was floated onto molten solder at 260° C., and the time until a swell was generated was measured.

Copper foil peeling strength: The strength was measured substantially based on the method defined by JIS-C-6481.

Flame retardance: All the copper foils on the FR-4 grade substrate of 0.2 mm thickness were etched, and the resin films having copper foils at both end planes of the embodiments and the comparative examples were pressed for forming tests pieces. The test pieces were evaluated substantially based on a method defined by the UL-94 vertical evaluating method.

TABLE 5

| Embodiment | Moldability | Soldering heat resistance (sec.) | Peeling strength (KN/m) | Flame retardance UL-94 |
|---|---|---|---|---|
| 27 | No void, no blur | >180 | 1.5 | Equ. to V-0[1)] |
| 28 | No void, no blur | >180 | 1.5 | Equ. to V-0 |
| 29 | No void, no blur | >180 | 1.5 | Equ. to V-0 |
| C-9 | No void, no blur | 56 | 1.2 | Equ. to V-0 |
| C-10 | No void, no blur | >180 | 1.5 | Equ. to V-0 |

As the Table 5 indicates, it was confirmed that the copper foil clad resin film of the embodiments 27–29 had a desirable moldability as a material for a multilayered circuit board, and the four layer circuit boards using the copper foil clad resin film of the present invention had a desirable soldering heat resistance because the modified cyanate ester group resin reacted with the specified monovalent phenolic compound, and the resin film had the same characteristics as the conventional prepreg for adhesion using a glass cloth as a basic material.

What is claimed is:
1. A modified cyanate ester group curable resin composition comprising:
(A) a cyanate ester group compound expressed by chemical formula (1),

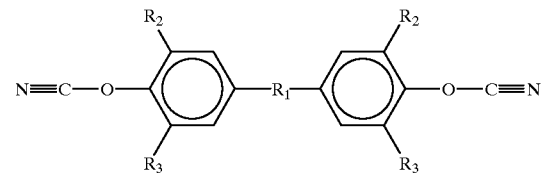

Formula (1)

where, $R_1$ is

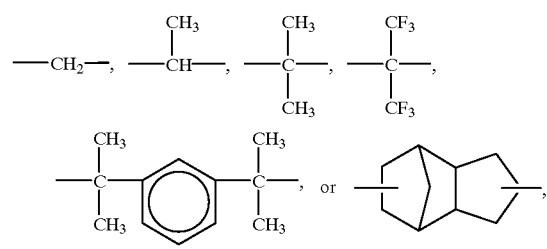

and $R_2$ and $R_3$ is any one of hydrogen or methyl group, and the both can be the same or different from each other, (B) a monovalent phenolic group compound expressed by chemical formula (2), or formula (3),

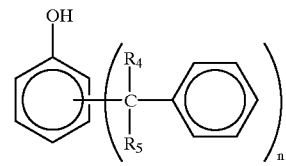

Formula (2)

where $R_4$ and $R_5$ is any one of hydrogen atom or low alkyl group having 1 to 4 carbon atoms, and the both can be the same or different from each other, n is a positive integer of 1 or 2,

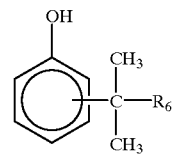

Formula (3)

where, $R_6$ is any one of —$CH_3$, —$CH_2CH_3$,

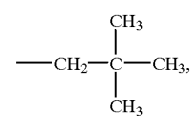

wherein the composition includes 4 to 30 parts by weight of (B) the monovalent phenolic croup compound to 100 parts by weight of (A) the cyanate ester group compound, the monovalent phenolic group compound being reactive with, or reacted with, the cyanate ester group compound, (C) a polyphenylene ether resin, (D) a flame retardant not reactive with the cyanate ester group compound, and (E) a metal group reaction catalyst.

2. A modified cyanate ester group curable resin composition as claimed in claim 1, which comprises a modified cyanate ester resin manufactured by the reaction of A) the cyanate ester group compound with a part of or all of (B) the monovalent phenolic group compound, (C) the polyphenylene ether resin, (D) the flame retardant not reactive with the cyanate ester group compound, and (E) the metal group reaction catalyst.

3. A modified cyanate ester group curable resin composition as claimed in claim 1, wherein said modified cyanate ester group curable resin composition comprises:

5 to 300 parts by weight of (C) the polyphenylene ether resin, to 100 parts of (A) the cyanate ester group compound;

1 to 300 ppm of (E) the metal group reaction catalyst to the cyanate ester group compound of 1; and 5 to 30 parts by weight of (D) the flame retardant not reactive with the cyanate ester group compound to 100 parts by weight of the total of said (A), (B) and (C).

4. A modified cyanate ester group curable resin composition as claimed in claim 1, wherein (A) the cyanate ester group compound is any one of or a mixture of 2,2-bis(4-cyanato-phenyl)propane and bis (3,5-dimethyl-4-cyanato-phenyl)methane.

5. A modified cyanate ester group curable resin composition as claimed in claim 1, wherein (B) the monovalent phenolic group compound is any one of p-(α-cumyl)phenol, p-tert-butylphenol, p-tert-amylphenol, and p-tert-octylphenol.

6. A modified cyanate ester group curable resin composition as claimed in claim 1, wherein (C) the polyphenylene ether resin is an alloyed polymer of poly(2,6-dimethyl-1,4-phenylene)ether and polystyrene or styrene-butadiene copolymer; and said poly(2,6-dimethyl-1,4-phenylene)ether is contained more than 50% by weight.

7. A modified cyanate ester group curable resin composition as claimed in claim 1, wherein (D) the flame retardant not reactive with the cyanate ester group compound is any one of single kind and mixture of alicyclic flame retardants selected from the group consisting of 1,2-dibromo-4-(1,2-dibromoethyl) cyclohexane, tetrabromocyclooctane and hexabromocyclododecane.

8. A modified cyanate ester group curable resin composition as claimed in claim 1, wherein (D) the flame retardant not reactive with the cyanate ester group compound is any one of a triphenylcyanulate bromide group flame retardant expressed by the chemical formula (4),

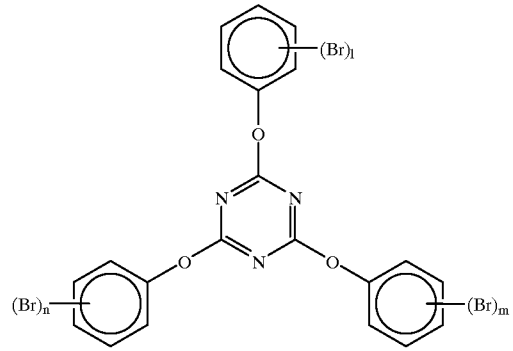

Formula (4)

where, each of l, m, and n is an integer of 1 to 5, and the integers can be the same or different from one another.

9. A modified cyanate ester group curable resin composition as claimed in claim 1, wherein (D) the flame retardant not reactive with the cyanate ester group compound is any one of mixtures of a triphenylcyanulate bromide group flame retardant expressed by the chemical formula (4) and two or more kinds of flame retardants not reactive with the cyanate ester group compound.

10. A modified cyanate ester group curable resin composition as claimed in claim 1, wherein (E) the metal group reaction catalyst is any one of single kind and a mixture of two or more kinds selected from the group consisting of 2-ethylhexanoic salts, naphthenic salts, and acetylacetone complexes of manganese, iron, cobalt, nickel, copper and zinc.

* * * * *